United States Patent [19]
Walker et al.

[11] Patent Number: 5,286,974
[45] Date of Patent: Feb. 15, 1994

[54] CHARGED PARTICLE ENERGY ANALYZERS

[75] Inventors: Andrew R. Walker, Prestbury; Simon C. Page, Hadfield, both of England

[73] Assignee: Kratos Analytical Limited, Urmston, England

[21] Appl. No.: 962,250

[22] Filed: Oct. 16, 1992

[30] Foreign Application Priority Data

Oct. 18, 1991 [GB] United Kingdom ............ 9122161.4

[51] Int. Cl.$^5$ .............................................. H01J 49/44
[52] U.S. Cl. ..................................... 250/305; 250/306
[58] Field of Search ............... 250/305, 306, 307, 309, 250/310

[56] References Cited

U.S. PATENT DOCUMENTS

| | | | |
|---|---|---|---|
| 4,146,787 | 3/1979 | Fite | 250/305 |
| 4,748,325 | 5/1988 | Slodzian | 250/309 |
| 4,810,879 | 3/1989 | Walker | 250/305 |
| 5,185,524 | 2/1993 | Dage | 250/305 |

FOREIGN PATENT DOCUMENTS

| | | |
|---|---|---|
| 254128 | 1/1988 | European Pat. Off. . |
| 417354 | 3/1991 | European Pat. Off. . |
| 1365369 | 9/1974 | United Kingdom . |

Primary Examiner—Paul M. Dzierzynski
Assistant Examiner—Kiet T. Nguyen
Attorney, Agent, or Firm—Leydig, Voit & Mayer

[57] ABSTRACT

A charged particle energy analyser has a magnetic lens such as a snorkel-type lens and a source for directing ionising radiation onto a specimen causing charged particles to be emitted from its surface. The specimen is immersed in the magnetic imaging field of the magnetic lens so that particles having energies in a predetermined energy range are brought to a focus, the energies of the focussed particles being analysed by an energy analyser. An electrode arrangement is provided for enabling the magnetic imaging field of the magnetic lens to utilise unfocussed particles to cause charge neutralisation of the specimen. Alternatively, charged particles from a source are subjected to an electric field which is transverse to the optical axis of the magnetic lens and are guided onto the specimen by the magnetic imaging field of the magnetic lens.

25 Claims, 4 Drawing Sheets

CHARGED PARTICLE ENERGY ANALYZERS

FIELD OF INVENTION

This invention relates to charged particle energy analysers. In particular, the invention relates to charged Particle energy analysers which are used to analyse the energies of charged particles emitted from the surface of a specimen by bombarding the specimen with suitable ionising radiation. The energy spectrum of the emitted particles provides information about the chemical composition of the specimen.

BACKGROUND OF THE INVENTION

The invention is concerned with charged particle energy analysers of this kind in which the specimen is immersed in the magnetic imaging field of a magnetic lens forming part of the input optics of the analyser. Charged Particle energy analysers such as this are described in our European Patent No. 243,060. The described energy analysers employ a snorkel type magnetic lens. A specimen under investigation is immersed in the magnetic imaging field of the lens and is bombarded with suitable ionising radiation, such as soft X-radiation or ultra-violet radiation, causing photoelectrons to be emitted from the surface thereof.

In the case of an electrically isolated, non-conductive specimen, the emission of photoelectrons from its surface causes the specimen to become positively electrically charged and this has the undesirable effect of distorting the energy spectrum of the emitted particles and causing a loss of energy resolution. With a view to neutralising this surface charge, it has been customary to direct low energy electrons at the surface of the specimen using a low energy flood gun or, alternatively, a source of ultraviolet radiation which creates a cloud of low energy photoelectrons by photo emission from the walls of the analyser chamber. However, these techniques have proved unsatisfactory when the specimen is immersed in the magnetic imaging field of a magnetic lens. This is because the magnetic field in the vicinity of the specimen is relatively strong and tends to deflect the incident low energy electrons away from the surface of the specimen.

It is an object of the invention to provide a charged particle energy analyser which at least alleviates this problem.

SUMMARY OF THE INVENTION

According to the invention, there is provided a charged particle energy analyser comprising a magnetic lens, a source of radiation arranged to direct radiation onto a specimen to cause charged particles to be emitted therefrom, the specimen being immersed in the magnetic imaging field of the magnetic lens whereby emitted particles having energies in a predetermined energy range are brought to a focus by the magnetic imaging field and emitted particles having energies outside that energy range are unfocussed, analysing means for analysing the energies of the focussed particles and means for enabling the magnetic imaging field to guide charged particles onto the specimen whereby to modify the charge thereon.

With this arrangement, the magnetic imaging field is enabled to guide charged particles onto the specimen whereby to modify the charge thereon, even though the specimen is immersed in the magnetic imaging field of the magnetic lens.

In one embodiment of the invention, the enabling means comprises an electrode arrangement for utilising at least some of the unfocussed particles in order to modify the charge on the specimen and, to that end, the electrode arrangement may be effective to accelerate said unfocussed particles and/or secondary charged particles derived from said unfocussed particles, towards the specimen enabling the magnetic imaging field to guide at least some of the accelerated particles onto the specimen whereby to modify the charge thereon.

The charged particle energy analyser may include means for generating at the electrode arrangement further charged particles having the same polarity as said emitted charged particles, said enabling means being effective to accelerate the further charged particles towards the specimen, enabling said magnetic imaging field to guide at least some of the accelerated further charged particles onto the specimen in order to modify the charge thereon.

The strength of the electrostatic accelerating field generated by the electrode arrangement and/or the intensity of radiation directed onto the electrode arrangement by said source of radiation can be regulated to cause substantial charge neutralisation of the specimen.

In another embodiment of the invention, the enabling means may comprise a source of charged particles having the same polarity as the emitted particles and field generating means for subjecting charged particles from the source to an electric field which is substantially transverse to the optical axis of the magnetic imaging field, whereby charged particles from the source are caused to drift towards said optical axis and are guided onto the specimen by the magnetic imaging field.

The source of charged particles is preferably a heated filament which may also form the field generating means.

In the latter case, the heated filament may be semicircular, being centered on the optical axis of the magnetic imaging field. The field generating means may additionally or alternatively comprise a pair of electrode plates.

In another arrangement, the field generating means comprises electrode means, and the source of charged particles comprises a source of ionising radiation arranged to direct radiation onto the electrode means to cause charged particles to be emitted therefrom.

BRIEF DESCRIPTION OF THE DRAWINGS

A charged particle energy analyser in accordance with the invention is now described, by way of example only, with reference to the accompanying drawings in which.

DESCRIPTION OF THE PREFERRED EMBODIMENT

Charged particle energy analysers in accordance with the invention can be used to analyse the energies of electrons, positive ions or negative ions emitted from a specimen. However, for ease of description, the charged particle energy analyser described hereinafter with reference to the drawings is a photoelectron spectrometer which is concerned with analysing the energies of electrons; more specifically, photoelectrons which are emitted from a specimen by bombarding it with primary radiation, such as X-radiation, or other suitable ionising radiation.

Figure 1:
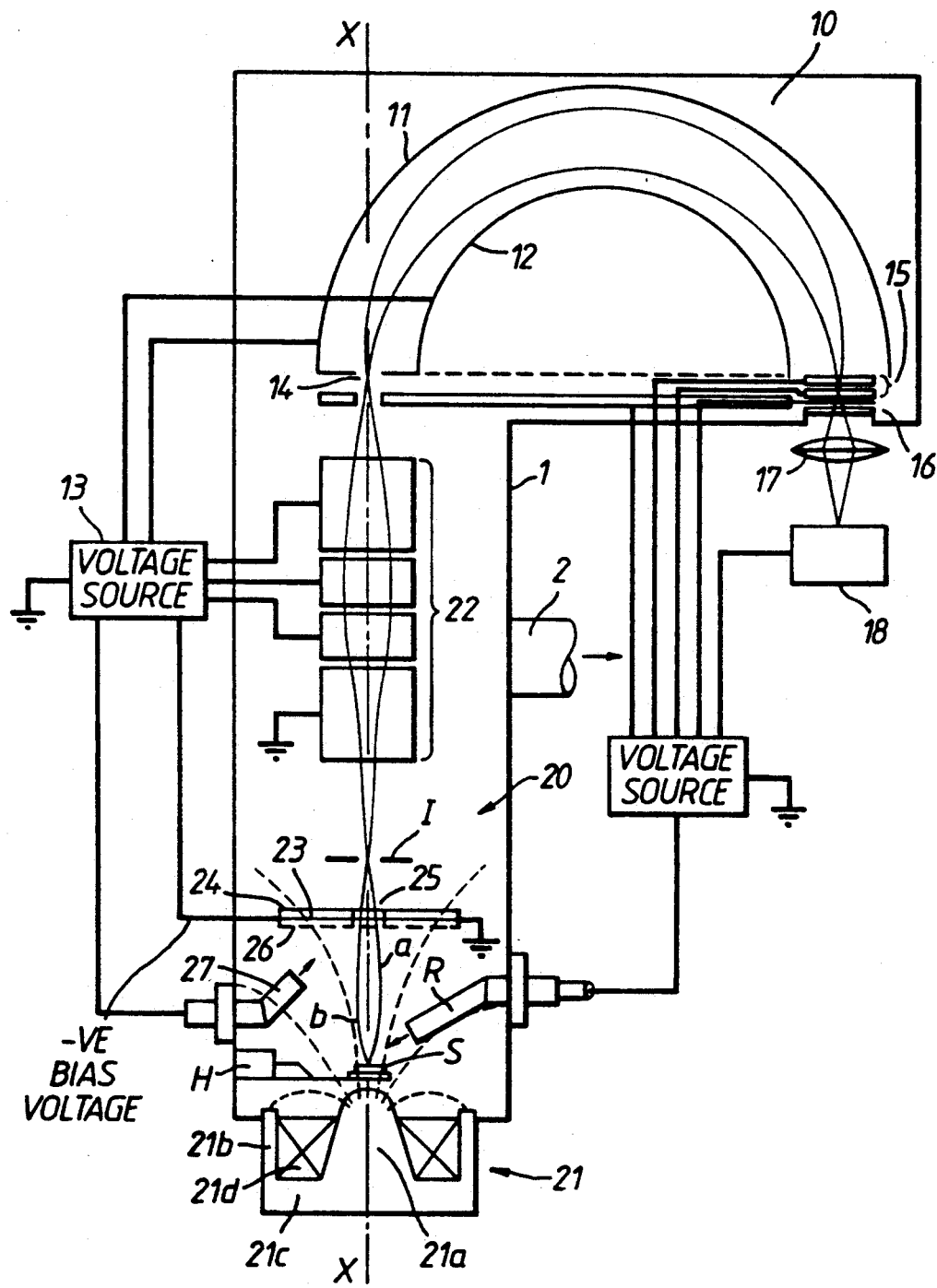
FIG. 1 is a diagrammatic section through the charged particle energy analyser.

Referring now to FIG. 1, the photoelectron spectrometer comprises an electron energy analyser 10, input optics 20 associated with the energy analyser 10, a specimen holder H on which a specimen S can be mounted and source R of X-radiation, such as MgK $\alpha$ radiation, for directing the radiation onto a surface of the specimen S causing secondary photoelectrons to be emitted therefrom.

These components are housed in a vacuum tight enclosure 1 which is evacuated by a suitable high vacuum pump (not shown) connected to a pumping port 2.

The electron energy analyser 10 is of the well-known hemispherical electrostatic kind comprising a pair of concentric metal hemispheres 11,12 which are maintained by a suitable voltage source 13 at different electrical potentials. As will be described in greater detail, photoelectrons to be analysed are focussed by the input optics 20 at an entrance slit 14 of the energy analyser 10 and are separated by the electric field in the space between the hemispheres according to their different energies.

The energy-separated electrons are detected by a focal plane detector 15 which consists of a pair of microchannel plates, and adjacent the microchannel plates a phosphor screen 16. Typically, a lens system 17 is provided to focus light from the phosphor screen 16 onto a charge coupled detector array 18 or other light-sensitive detector.

By this means, the electron energy analyser 10 generated an energy spectrum of the photoelectrons received at the entrance slit 14.

The input optics 20 of the photoelectron spectrometer has a magnetic lens 21 which, in this embodiment, is of the snorkel-type, being comprised of a center Polepiece 21a located on the optical axis X—X of the input optics, an annular, coaxial polepiece 21b and a base 21c integral with the polepieces 21a and 21b. An energisation coil 21d is mounted in the annular trough between the polepieces 21a and 21b to excite the center Polepiece 21a when energised with electrical current whereby to produce a magnetic imaging field along the axis X—X.

The specimen S mounted on holder H is immersed in the magnetic imaging field of the magnetic lens 21 immediately in front of the center polepiece 21a, and X-radiation from the source R is directed onto the specimen causing photoelectrons to be emitted therefrom.

The electrical current supplied to the energisation coil 21d is chosen in order that the magnetic imaging field is of such a strength as to guide and focus photoelectrons having energies in a selected, narrow energy band. Such photoelectrons are brought to a focus at an image plane I which coincides with the object plane of an electrostatic, multi-electrode lens assembly 22 the purpose of which is to retard the received photoelectrons and focus them at the entrance slit 14 of the energy analyser 10 in order that they may enter the analyser for analysis.

If desired, the spectrometer could be operated in a scanning mode in which the electrical current supplied to the energisation coil 21d of the magnetic lens, and the electrical potentials applied to the hemispheres 11,12 of the energy analyser are swept synchronously whereby to scan the energy band selected by the magnetic lens through the entire energy spectrum of photoelectrons emitted from the specimen.

The curved lines a,b in FIGS. 1 and 2 are diagrammatic representations of the trajectories followed by two exemplary photoelectrons $P_a$ and $P_b$ having energies which lie within the narrow energy band selected by the magnetic lens. In fact, such photoelectrons follow helical trajectories around the optical axis X—X.

Figure 2A:
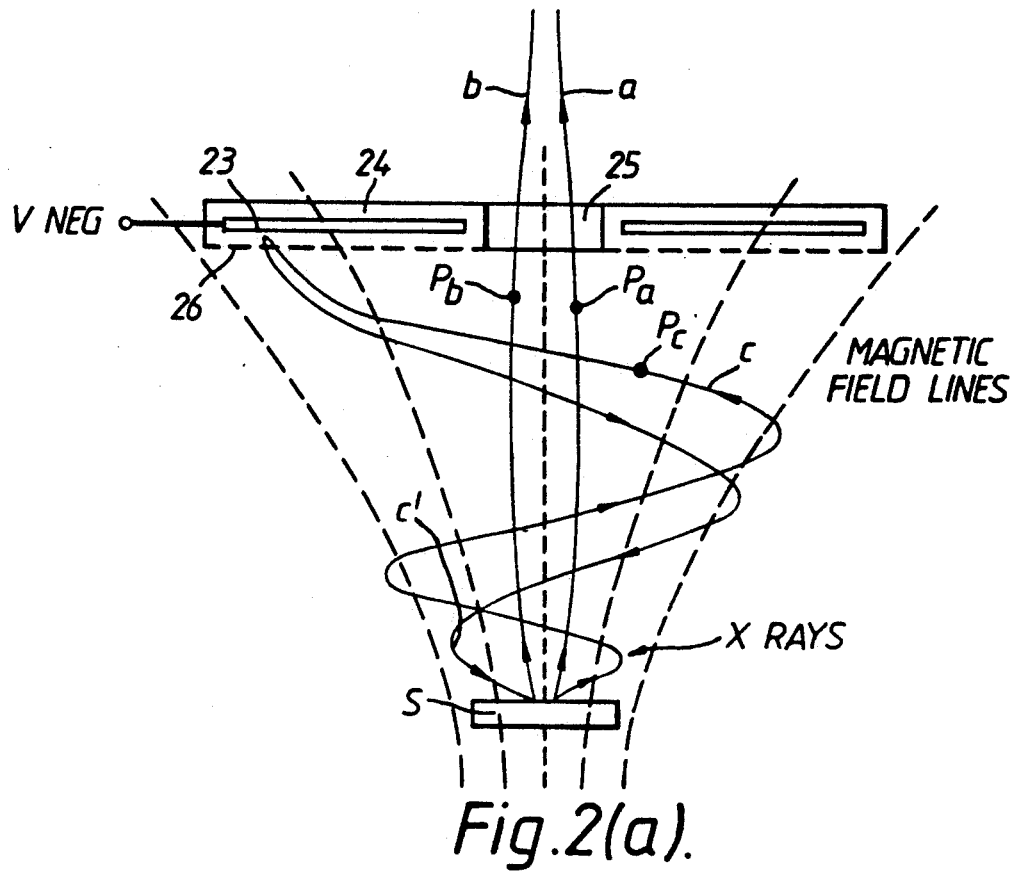
FIGS. 2(a) to 2(c) are diagrammatic sections, on an enlarged scale, through part of the input optics of the charged particle energy analyser of FIG. 1.
Figure 2B:
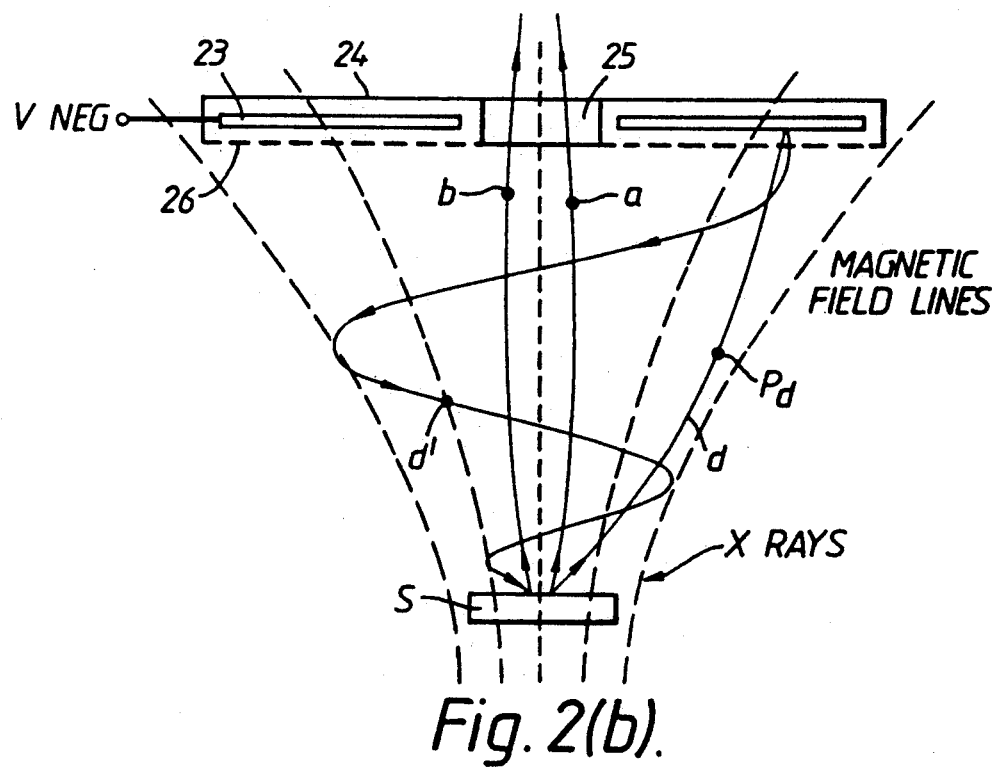
Figure 2C:
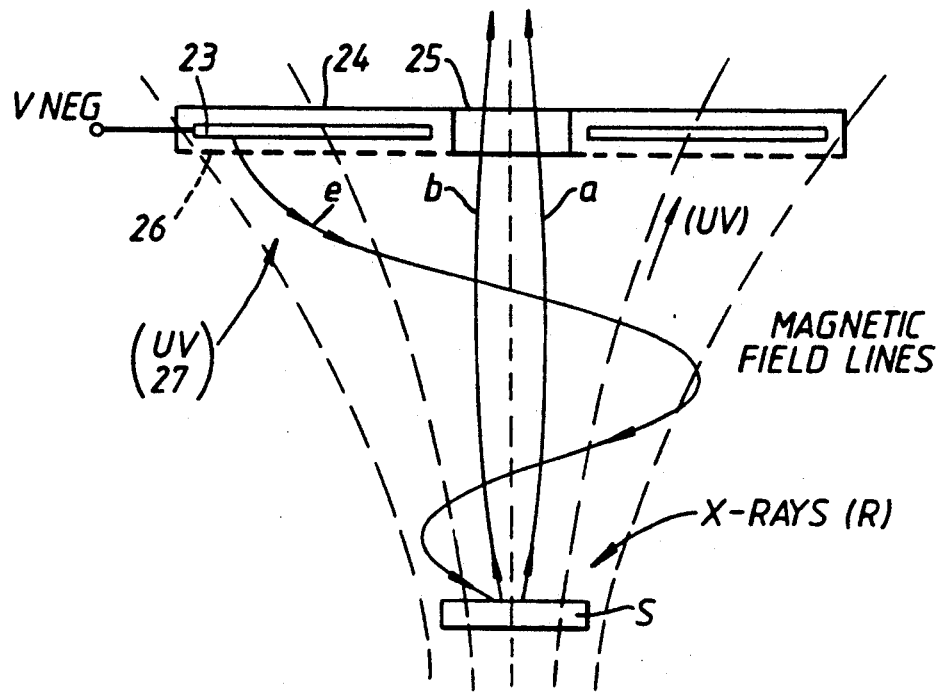

Photoelectrons which have energies outside the energy band selected by the magnetic lens will not be brought to a focus, and the curved lines c and d, shown in FIGS. 2(a) and 2(b) respectively are diagrammatic representations of the trajectories followed by two such unfocussed photoelectrons.

Curve c, shown in FIG. 2(a), represents the trajectory followed by a photoelectron $P_c$ having an energy less than the lower bound of the selected energy band, whereas curve d, shown in FIG. 2(b), represents the trajectory followed by a photoelectron $P_c$ having an energy greater than the upper bound of the selected energy band. As before, the two photoelectrons $P_c$ and $P_d$ follow helical trajectories. The photoelectron $P_c$ (which has a relatively low energy) is more tightly bound to the magnetic field lines of the magnetic imaging field than are photoelectrons $P_a$ and $P_b$ and is therefore overfocussed, whereas the photoelectron $P_d$ in FIG. 2(b) (which has a relatively high energy) is less tightly bound to the magnetic field lines and is underfocussed.

As represented in FIG. 2(a), overfocussed photoelectrons will follow divergent, helical trajectories.

In the case of an electrically isolated, non-conductive specimen the emission of Photoelectrons from its surface causes the specimen to become positively charged and, as already explained, this may distort the energy spectrum of the analysed electrons and cause a loss of energy resolution.

It is with the aim of alleviating this problem that there is provided an annular electrode plate 23, located within the magnetic imaging field between the specimen S and the image plane I. The electrode plate is maintained at a negative electrical potential producing an electrostatic accelerating field which is confined to the vicinity of the plate by an annular, earthed termination screen 24.

By this means, the electrostatic accelerating field will have no effect on the motion of the focussed photoelectrons which pass through the central aperture 25 of the electrode plate 23. However, unfocussed photoelectrons can enter the electrostatic field region of the plate through a coarse mesh 26 which forms a wall of the termination screen 24 facing the specimen.

The electrode plate 23 is positioned sufficiently close to the specimen that the electrostatic accelerating field is effective to reflect at least some of the overfocussed photoelectrons in dependence on their energies. The electrostatic field accelerates the reflected Photoelectrons towards the specimen enabling at least some of them to be guided back onto the specimen by the magnetic imaging field of the magnetic lens 21. Curve c' in FIG. 2a represents the helical trajectory followed by the reflected overfocussed photoelectron $P_c$ as it is returned to the surface of the specimen.

The relatively high energy, underfocussed photoelectrons are generally too energetic to be reflected in the above-described fashion. However, at least some of the underfocussed photoelectrons will impinge on the electrode Plate 23 causing lower energy, secondary electrons to be emitted therefrom. As in the case of the overfocussed photoelectrons, secondary electrons emitted from the surface of electrode plate 23 will be accelerated towards the specimen S enabling at least some of them to be guided onto the specimen by the magnetic imaging field of the magnetic lens, as represented by the curve d' in FIG. 2(b).

It will be appreciated that the electrical potential applied to the annular electrode plate 23 can be regulated in order to achieve a balance between the charge which is lost from the specimen as a result of photoelectrons being emitted from its surface and the charge which is gained by the specimen due to the influence of the electrostatic field produced by the annular electrode plate 23. In this way, charge neutralisation of the specimen can be achieved reliably without recourse to the unsatisfactory techniques adopted hitherto.

In some operational circumstances, such as when a highly localised source of ionising radiation, e.g. an electron beam or focussed monochromatic X-ray source is used, the proportion of focussed photoelectrons could be relatively high and there may be too few unfocussed photoelectrons to achieve charge neutralisation of the specimen. In these circumstances, it is desirable to provide a source of additional low energy electrons. To that end, a source 27 of ultraviolet radiation, or other ionising radiation is used to illuminate the annular electrode plate 23, causing low energy photoelectrons to be emitted from its surface. As represented by curve e in FIG. 2(c) such low energy photoelectrons are accelerated towards the specimen S by the electrostatic field produced by the electrode plate 23 enabling at least some of them to be guided onto the specimen by the magnetic imaging field of the magnetic lens 21.

Figure 3:
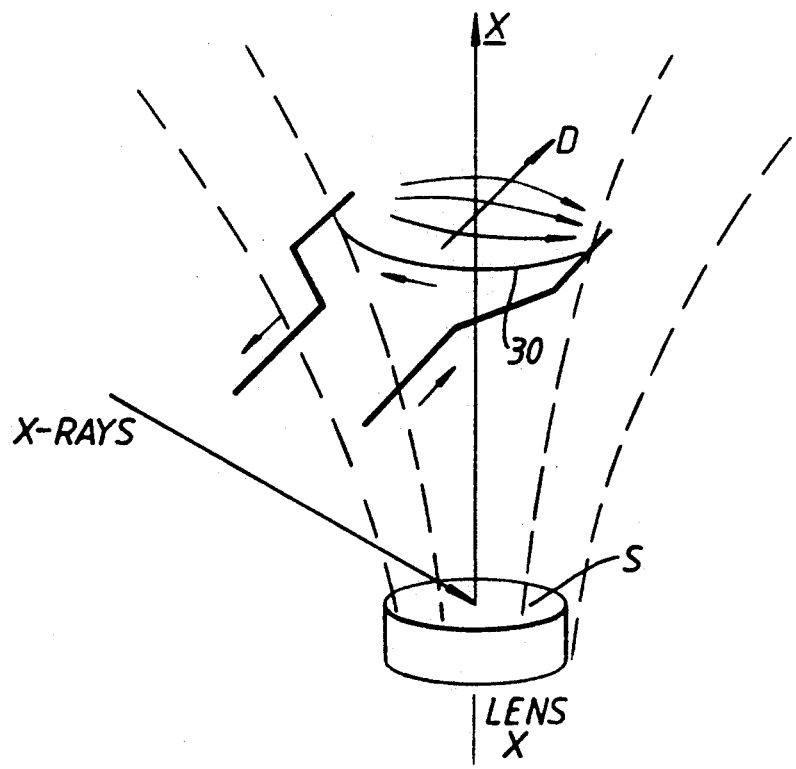
FIGS. 3 to 5 are diagrammatic illustrations of further embodiments of the invention.
Figure 4:
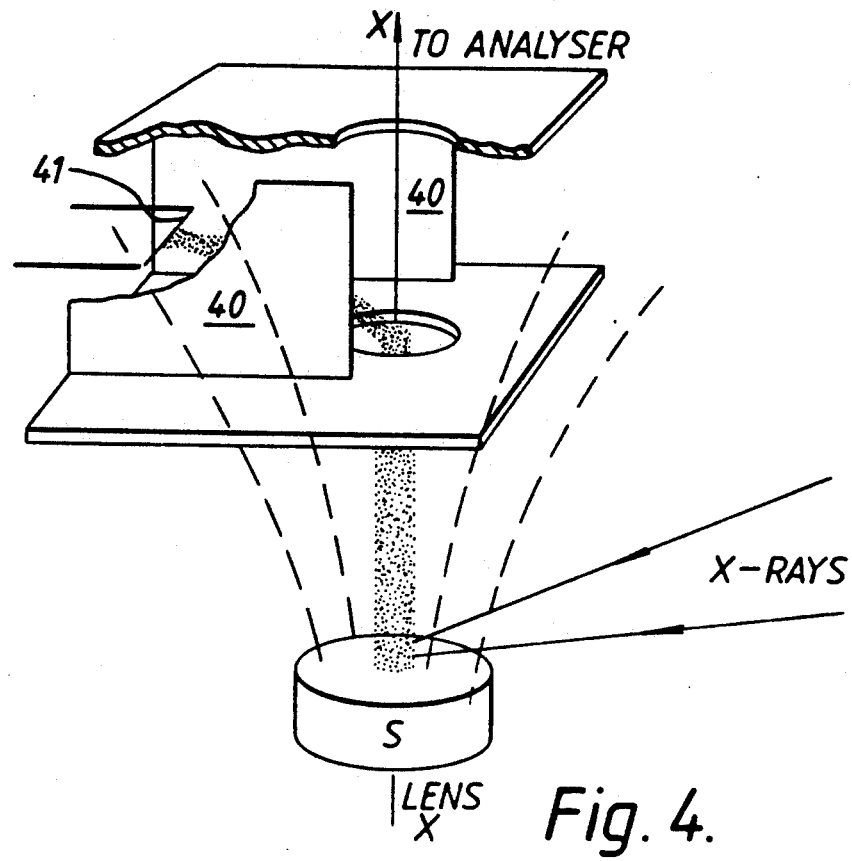
Figure 5:
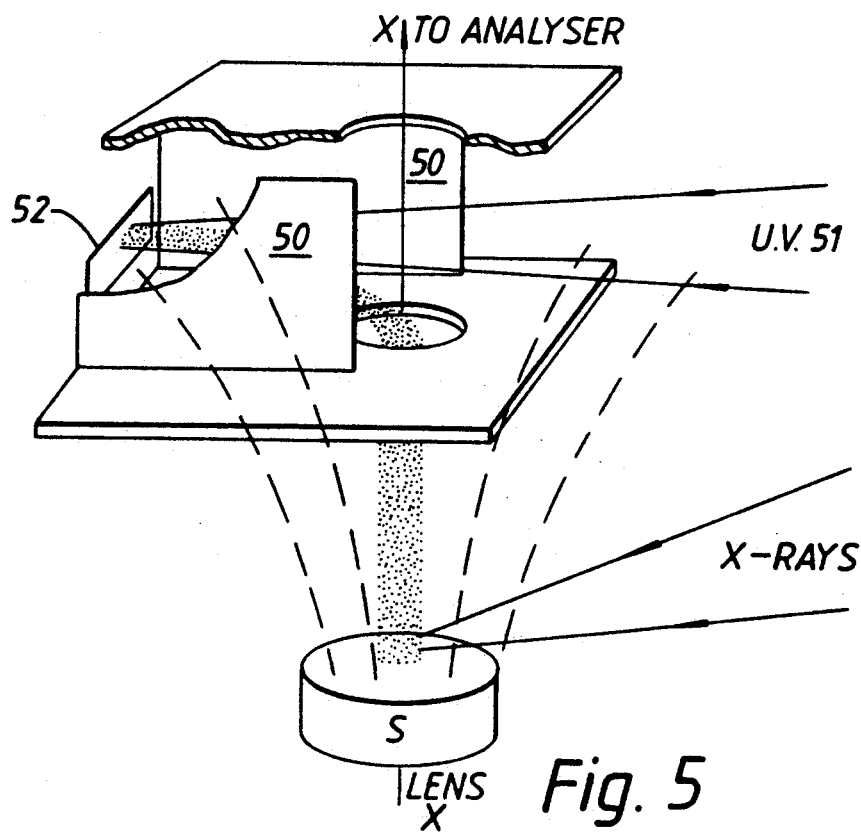

FIGS. 3 to 5 show three further embodiments of the invention.

Referring to FIG. 3, a heated tungsten filament 30 provides a source of neutralising electrons. The filament, which is semi-circular, is centered on the optical axis X—X of the magnetic imaging field and is so orientated that a weak electric field produced across the ends of the filament is transverse to the magnetic imaging field.

The polarity of the filament is such that the combined effects of the mutually orthogonal electric and magnetic fields is to cause the emission electrons from the filament to drift inwardly towards axis X—X, in the direction indicated by arrow D. As the emission electrons approach axis X—X, they are guided onto specimen S by the field lines of the magnetic imaging field.

The drift velocity of the emission electrons is given by the ratio E/B of the electric and magnetic field strengths. Therefore, the weaker the electric field the lower will be the drift velocity, and hence energy of the emission electrons that reach the optical axis X—X.

A relatively weak electric field is found to be advantageous. If an excess of electrons is delivered to the specimen, the (unwanted) charging effect of these electrons will be reduced due to their relatively low energies. Optical distortion caused by the effect of strong electric fields on the path of Photoelectrons a and b in FIG. 1 will also be reduced.

Referring to FIG. 4, the transverse electric field is produced by a pair of electrode plates 40,40' disposed to one side of the optical axis X—X.

In the illustrated embodiment, the source 41 of neutralising electrons is a straight, heated tungsten filament; however, a curved (e.g. semi-circular) filament could alternatively be used. A suitable d.c. bias voltage is applied across the electrode plates, and their polarity is such that the emission electrons from the heated filament will drift towards the optical axis X—X. The emission electrons are then guided onto the specimen S by the converging field lines of the magnetic imaging field.

In the embodiment shown in FIG. 5, the transverse electric field is again produced by electrode plates 50,50', as in the arrangement of FIG. 4. However, the heated filament is replaced by a source 51 of ultraviolet, or other ionising radiation which is directed to illuminate electrode plate 51 and or plates 50,50" causing low energy photoelectrons to be emitted therefrom.

As before, the transverse electric field between the electrode plates causes the emitted electrons to drift towards the optical axis X—X, and the electrons are then guided onto specimen S by the magnetic imaging field.

In operation of the charged particle energy analyser, the strength of the magnetic imaging field may be varied by a factor of up to about four.

In the embodiments described with reference to FIGS. 3 to 5, ideally, the afore-mentioned ratio E/B should be kept substantially constant in order to maintain the same degree of charge neutralisation even if the magnetic field strength B is caused to vary. To that end, the electric field strength E may be scaled in Proportion to the magnetic field strength B, and this can be accomplished by ramping the d.c. voltage applied to the electrode plates 40,40'; 50,50' with the energising current supplied to magnetic lens 21.

It will be understood that although the invention has been described with reference to a photoelectron spectrometer, the invention is applicable to other kinds of charged particle energy analyser, such as charged particle microscopes, including spectromicroscopes as described, for example, in European Patent No. 243,060.

We claim:

1. A charged particle energy analyser comprising a magnetic lens, a source of radiation arranged to direct radiation onto a specimen to cause charged particles to be emitted therefrom, the specimen being immersed in the magnetic imaging field of the magnetic lens whereby emitted particles having energies in a predetermined energy range are brought to a focus by the magnetic imaging field and emitted particles having energies outside that energy range are unfocussed, analysing means for analysing the energies of the focussed particles and means for enabling the magnetic imaging field to guide said unfocussed charged particles and/or charged particles derived from said unfocussed charged particles onto the specimen whereby to modify the charge thereon.

2. A charged particle energy analyser as claimed in claim 1, wherein the enabling means comprises an electrode arrangement for utilising at least some of said unfocussed particles in order to modify the charge on the specimen.

3. A charged particle energy analyser as claimed in claim 2, wherein the electrode arrangement is effective to accelerate said unfocussed particles and/or secondary charged particles derived from said unfocussed particles, towards the specimen enabling the magnetic imaging field to guide at least some of the accelerated particles onto the specimen whereby to modify the charge thereon.

4. A charged particle energy analyser as claimed in claim 2, wherein the electrode arrangement comprises an annular electrode which is maintained, in operation, at a selectable d.c. bias potential and has a central aperture located on the optical axis of the magnetic lens.

5. A charged particle energy analyser as claimed in claim 4, wherein the electrode arrangement includes means to terminate the electrostatic accelerating field generated by the annular electrode.

6. A charged particle energy analyser as claimed in claim 5, wherein the termination means comprises an earthed screen disposed around the annular electrode.

7. A charged particle energy analyser as claimed in claim 2, wherein the electrode arrangement is effective to generate an electrostatic accelerating field, and the strength of the electrostatic accelerating field and/or the intensity of radiation directed onto the electrode arrangement by said further source of radiation being regulated to cause substantial charge neutralisation of the specimen.

8. A charged particle energy analyser as claimed in claim 1, including means for generating further charged particles having the same polarity as said emitted charged particles, said enabling means being effective to accelerate the further charged particles towards the specimen, enabling said magnetic imaging field to guide at least some of the accelerated further charged particles onto the specimen in order to modify the charge on the specimen.

9. A charged particle energy analyser as claimed in claim 8, wherein the enabling means comprises an electrode arrangement for utilising at least some of said unfocussed particles in order to modify the charge on the specimen and the means for generating said further charged particles comprises a further source of radiation arranged to direct radiation onto the electrode arrangement to cause the further charged particles to be emitted therefrom.

10. A charged particle energy analyser as claimed in claim 9, wherein the further source of radiation is a source of ultra-violet radiation.

11. A charged particle energy analyser as claimed in claim 1, wherein the magnetic lens is a snorkel-type lens.

12. A charged particle energy analyser as claimed in claim 1, in the form of an electron energy analyser.

13. A charged particle energy analyser as claimed in claim 12, in the form of a photoelectron spectrometer.

14. A charged particle energy analyser as claimed in claim 12, in the form of a photoelectron microscope.

15. A charged particle energy analyser comprising a magnetic lens, a source of radiation arranged to direct radiation onto a specimen to cause charged particles to be emitted therefrom, the specimen being immersed in the magnetic imaging field of the magnetic lens whereby emitted particles having energies in a predetermined energy range are brought to a focus by the magnetic imaging field and emitted particles having energies outside that energy range are unfocussed, analysing means for analysing the energies of the focussed particles, a source of charged particles having the same polarity as the emitted particles and field generating means for subjecting charged particles from the source to an electric field which is substantially transverse to the optical axis of the magnetic imaging field, whereby said charged particles from the source are caused to drift towards said optical axis and are guided by the magnetic imaging field onto the specimen whereby to modify the charge thereon.

16. A charged particle energy analyser as claimed in claim 15, wherein the source of charged particle is a heated filament.

17. A charged particle energy analyser as claimed in claim 16, wherein said generating means comprises the heated filament.

18. A charged particle energy analyser as claimed in claim 17, wherein the heated filament is semi-circular and is centered on the optical axis of the magnetic imaging field.

19. A charged particle energy analyser as claimed in claim 17, wherein the field generating means also comprises a pair of d.c. biassed electrode plates.

20. A charged particle energy analyser as claimed in claim 15, wherein the field generating means is independent of the source of charged particles.

21. A charged particle energy analyser as claimed in claim 20, wherein the source of charged particles is a heated filament and the field generating means comprises electrode means.

22. A charged particle energy analyser as claimed in claim 20, wherein the field generating means comprises electrode means, and the source of charged particles comprises a source of ionising radiation arranged to direct radiation onto the electrode means to cause charged particles to be emitted therefrom.

23. A charged particle energy analyser as claimed in claim 22, wherein the source of ionising radiation is a source of ultraviolet radiation.

24. A charged particle energy analyser as claimed in claim 15, wherein the magnetic lens is a snorkel-type lens.

25. A charged particle energy analyser as claimed in claim 15, in the form of an electron energy analyser.

* * * * *